US008940475B2

(12) United States Patent
Dunn et al.

(10) Patent No.: US 8,940,475 B2
(45) Date of Patent: Jan. 27, 2015

(54) DOUBLE PATTERNING WITH INLINE CRITICAL DIMENSION SLIMMING

(75) Inventors: Shannon W. Dunn, Altamont, NY (US); Dave Hetzer, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 898 days.

(21) Appl. No.: 13/158,868

(22) Filed: Jun. 13, 2011

(65) Prior Publication Data
US 2012/0128942 A1 May 24, 2012

Related U.S. Application Data

(60) Provisional application No. 61/416,496, filed on Nov. 23, 2010.

(51) Int. Cl.
H01L 21/033 (2006.01)
H01L 21/027 (2006.01)
G03F 7/00 (2006.01)
G03F 7/40 (2006.01)

(52) U.S. Cl.
CPC ........ H01L 21/0337 (2013.01); H01L 21/0274 (2013.01); G03F 7/0035 (2013.01); G03F 7/40 (2013.01); G03F 7/405 (2013.01); Y10S 438/947 (2013.01); Y10S 438/948 (2013.01)
USPC ............ 430/324; 430/322; 438/947; 438/948

(58) Field of Classification Search
CPC ........ G03F 7/26; H01L 21/033; H01L 21/027
USPC ..................... 430/324, 322; 428/64
See application file for complete search history.

(56) References Cited

U.S. PATENT DOCUMENTS

| 8,647,817 | B2 * | 2/2014 | Dunn et al. ................. 430/324 |
| 2009/0209105 | A1 | 8/2009 | Yaegashi et al. |
| 2010/0170871 | A1 | 7/2010 | Sone et al. |
| 2010/0291490 | A1 | 11/2010 | Tsuruda et al. |
| 2011/0070545 | A1 | 3/2011 | Dunn et al. |

OTHER PUBLICATIONS

European Patent Office, International Search Report and Written Opinion issued in corresponding Application PC/US2011/060386 dated Sep. 17, 2012, 10 pp.
Y. C. Bae et al., Materials for Single-Etch Double Patterning Process: Surface Curing Agent and Thermal Cure Resist (Abstract), Institute of Electrical Engineers, Advances in Resist Materials and Processing Technology Conference XXVI, San Jose, CA, Feb. 23-25, 2009, 2 pp.
T. I. Wallow et al., Photoresist Stabilization for Double Patterning Using 172 nm Photoresist Curing (Abstract), Institute of Electrical Engineers, Advances in Resist Materials and Processing Technology Conference XXVI, San Jose, CA, Feb. 23-25, 2009, 2 pp.

* cited by examiner

Primary Examiner — Marc Armand
(74) Attorney, Agent, or Firm — Wood, Herron & Evans, LLP

(57) ABSTRACT

A method for double patterning a substrate is described. The double patterning method may include a litho/freeze/litho/etch (LFLE) technique that includes a first (critical dimension) CD slimming process to reduce the first CD to a first reduced CD and a second CD slimming process to reduce the second CD to a second reduced CD.

18 Claims, 8 Drawing Sheets

DOUBLE PATTERNING WITH INLINE CRITICAL DIMENSION SLIMMING

CROSS-REFERENCE TO RELATED APPLICATIONS

Pursuant to 37 CFR §1.78(a)(4), this application claims the benefit of and priority to U.S. Provisional Application Ser. No. 61/416,496, filed on Nov. 23, 2010, the entire content of which is herein incorporated by reference.

BACKGROUND OF THE INVENTION

1. Field of Invention

The invention relates to a method for patterning a thin film on a substrate, and more particularly to a method for double patterning a thin film on a substrate.

2. Description of Related Art

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

More recently, a double patterning approach has been introduced to allow the patterning of smaller features at a smaller pitch than what is currently possible with standard lithographic techniques. One approach to reduce the feature size is to use standard lithographic pattern and etch techniques on the same substrate twice (i.e., LELE, or Litho/Etch/Litho/Etch), thereby forming larger patterns spaced closely together to achieve a smaller feature size than would be possible by single exposure. During LELE double patterning, the substrate is exposed to a first pattern, the first pattern is developed in the radiation-sensitive material, the first pattern formed in the radiation-sensitive material is transferred to an underlying layer using an etching process, and then this series of steps is repeated for a second pattern.

Another approach to reduce the feature size is to use standard lithographic pattern on the same substrate twice followed by etch techniques (i.e., LLE, or Litho/Litho/Etch), thereby forming larger patterns spaced closely together to achieve a smaller feature size than would be possible by single exposure. During LLE double patterning, the substrate is exposed to a first pattern, the substrate is exposed to a second pattern, the first pattern and the second pattern are developed in the radiation-sensitive material, and the first pattern and the second pattern formed in the radiation-sensitive material are transferred to an underlying layer using an etching process.

One approach to LLE double patterning includes a Litho/Freeze/Litho/Etch (LFLE) technique that utilizes an application of a freeze material on a first pattern in a first patterning layer to cause "freezing" or cross-linking therein, thus allowing the first patterning layer to withstand subsequent processing of a second patterning layer with a second pattern. However, conventional LFLE double patterning techniques still have a limit to the ultimate feature size that is printable.

SUMMARY OF THE INVENTION

The invention relates to a method for patterning a thin film on a substrate. The invention also relates to a method for double patterning a thin film on a substrate. The invention further relates to a method for double patterning a thin film on a substrate using a LFLE double patterning technique. Further yet, the LFLE double patterning technique includes a critical dimension (CD) slimming process.

According to one embodiment, a method for double patterning a substrate is described. The double patterning method may include a LFLE technique that includes a first CD slimming process to reduce a first CD to a first reduced CD and a second CD slimming process to reduce a second CD to a second reduced CD.

According to another embodiment, a method for double patterning a substrate is described. The method comprises: forming a first layer of radiation-sensitive material; preparing a first pattern in the first layer of radiation-sensitive material using a first lithographic process, the first pattern being characterized by a first critical dimension (CD); following the preparing the first pattern, performing a first CD slimming process to reduce the first CD to a first reduced CD; freezing the first pattern with the first reduced CD in the first layer of radiation-sensitive material using a freeze process; forming a second layer of radiation-sensitive material on the first pattern with the first reduced CD in the first layer of radiation-sensitive material; preparing a second pattern in the second layer of radiation-sensitive material using a second lithographic process, the second pattern being characterized by a second CD; and following the preparing the second pattern, performing a second CD slimming process to reduce the second CD to a second reduced CD.

According to yet another embodiment, a line pattern formed in one or more layers of radiation-sensitive material comprising a line pattern CD less than 20 nm is described.

DETAILED DESCRIPTION OF SEVERAL EMBODIMENTS

Figure 1A:
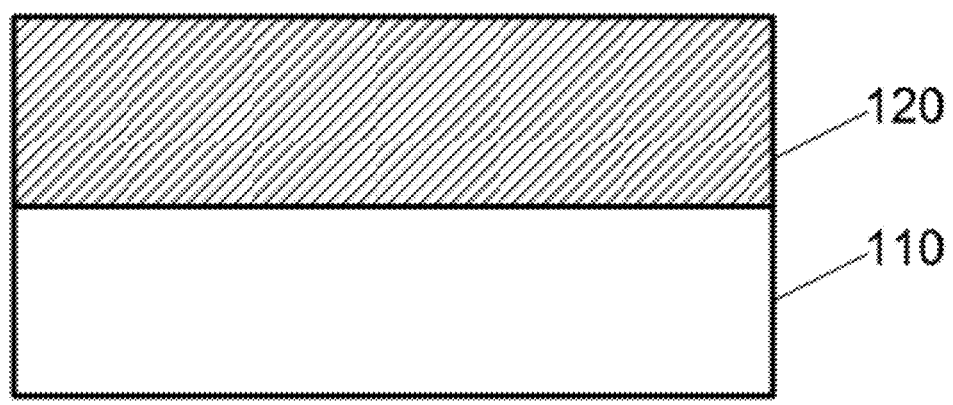
FIGS. 1A through 1G present a simplified schematic representation of a method of double patterning a substrate according to an embodiment.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Referring now to the drawings, wherein like reference numerals designate identical or corresponding parts throughout the several views, FIGS. 1A through 1G, and FIG. 2 illustrate a method for double patterning a substrate according to an embodiment. The method is illustrated in a flow chart 200, and begins in 210 with forming a first layer of radiation-sensitive material 120 on a substrate 110. The first layer of radiation-sensitive material 120 may include a photo-resist. For example, the first layer of radiation-sensitive material 120 may comprise a 248 nm (nanometer) resist, a 193 nm resist, a 157 nm resist, an EUV (extreme ultraviolet) resist, or an electron beam sensitive resist. Furthermore, for example, the first layer of radiation-sensitive material 120 may comprise a thermal freeze photo-resist, an electromagnetic (EM) radiation freeze photo-resist, or a chemical freeze photo-resist.

The first layer of radiation-sensitive material 120 may be formed by spin-coating the material onto substrate 110. The first layer of radiation-sensitive material 120 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

Figure 1B:
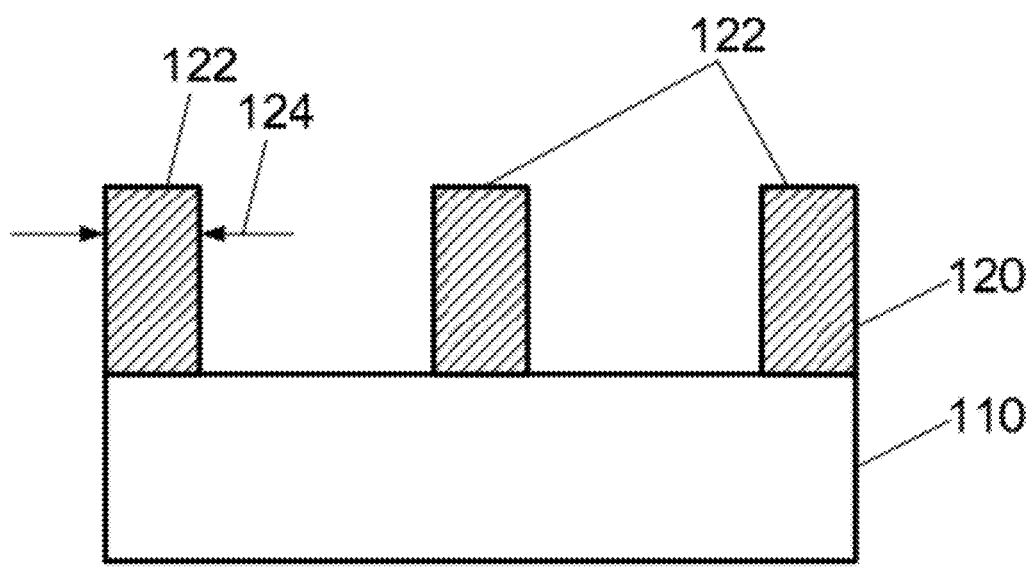

In 220 and as shown in FIG. 1B, the substrate 110 having the first layer of radiation-sensitive material 120 is aligned at a first alignment position in a radiation exposure system and imaged with first radiation having a first image pattern. The radiation exposure system may include a dry or wet photolithography system. The first image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the first image pattern may be formed using an electron beam lithography system.

The first layer of radiation-sensitive material 120, having been exposed to the first image pattern, is subjected to a developing process in order to remove the first image pattern region, and form a first pattern 122 in the first layer of radiation-sensitive material 120. The first pattern 122 may be characterized by a first critical dimension (CD) 124. The first pattern 122 may include a first line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

Figure 1C:
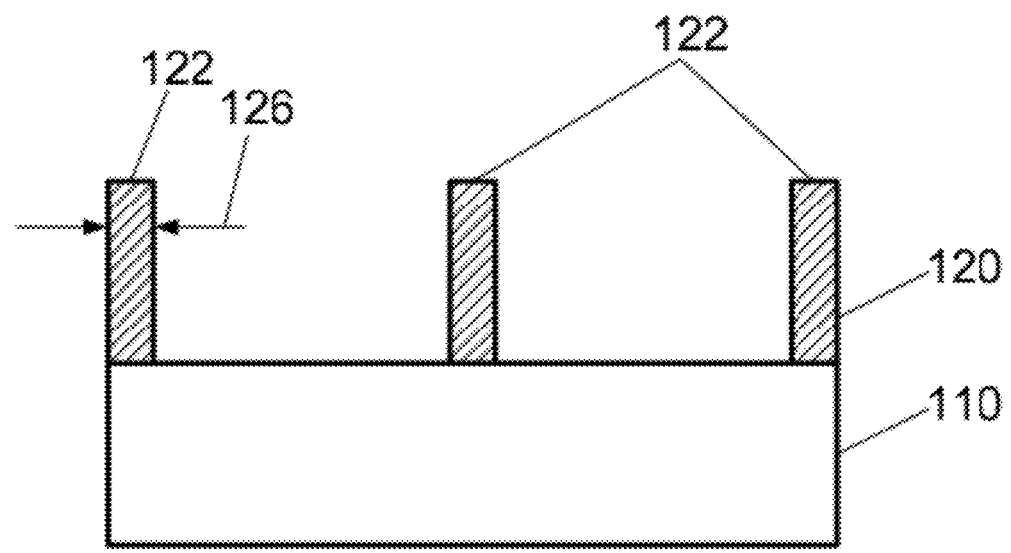
Figure 3:
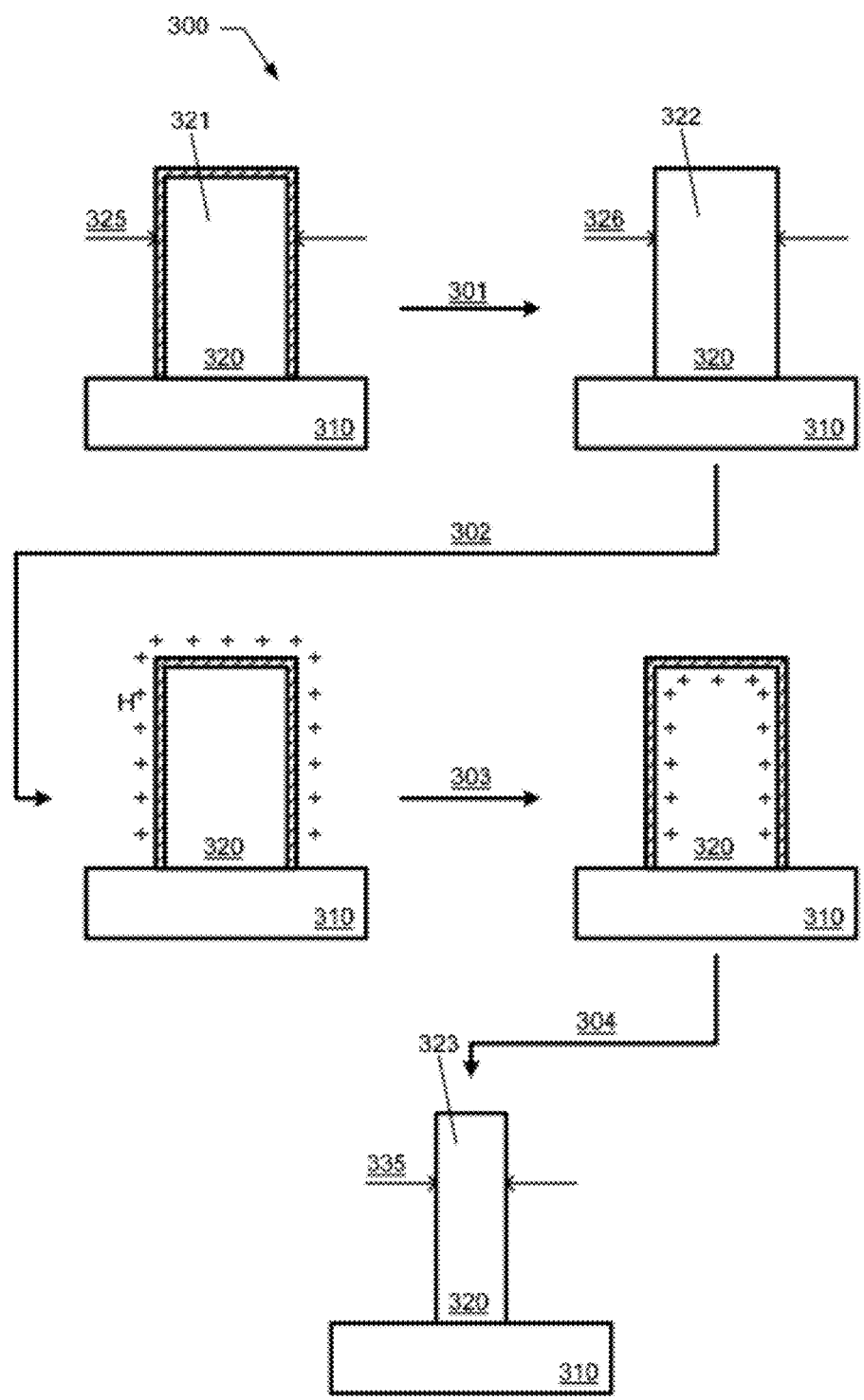
FIG. 3 presents a simplified schematic representation of a method for performing a CD slimming process according to another embodiment.
Figure 4A:
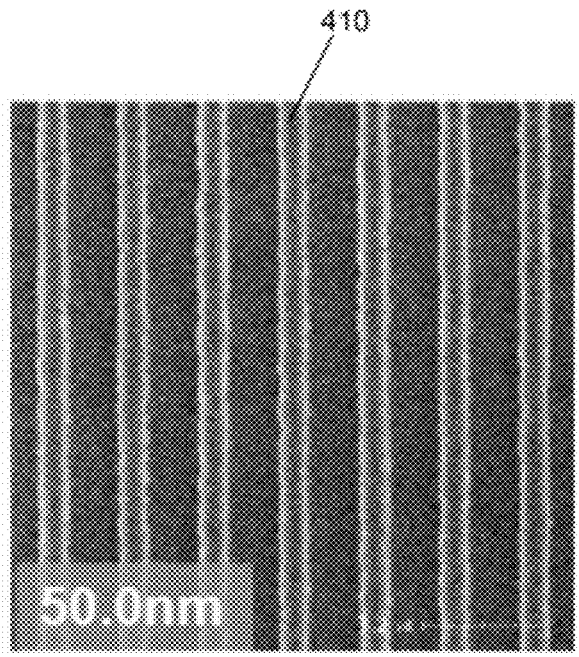
FIGS. 4A and 4B provide exemplary data for performing a CD slimming process.
Figure 4B:
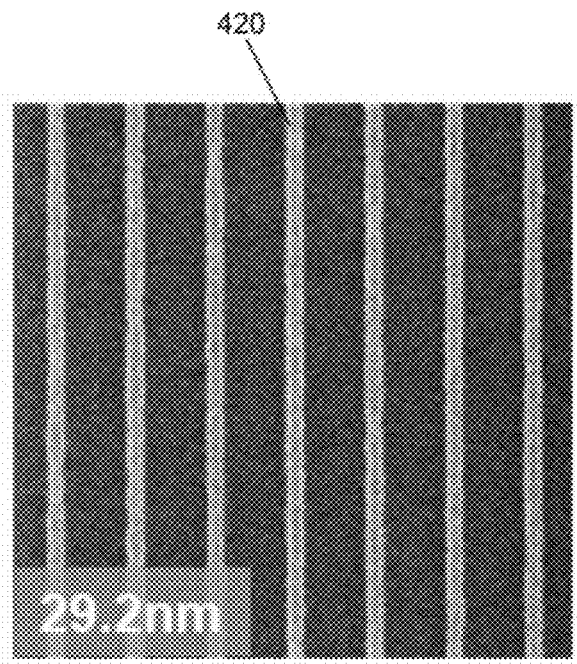

In 230 and as shown in FIG. 1C, a first critical dimension (CD) slimming process is performed to reduce the first CD 124 to a first reduced CD 126. FIG. 3 illustrates a CD slimming process, and FIGS. 4A and 4B provide exemplary data for the CD slimming process.

Figure 1D:
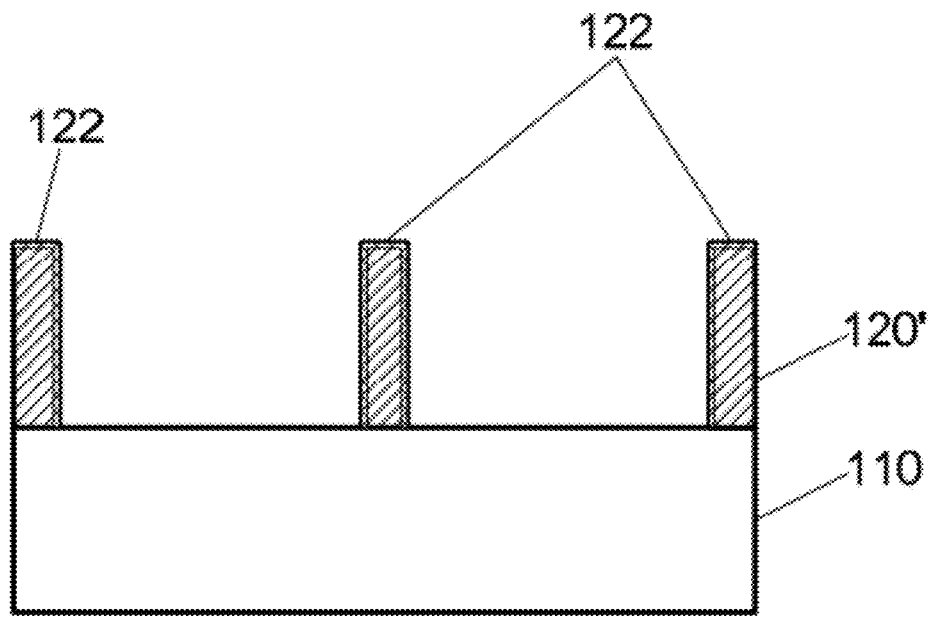

In 240 and as shown in FIG. 1D, the first pattern 122 with the first reduced CD 126 in the first layer of radiation-sensitive material 120 is frozen using a freeze process to form a frozen first layer of radiation-sensitive material 120'. In one embodiment, the first layer of radiation-sensitive material 120 may include a thermally curable freeze resist, wherein freezing the first pattern 122 in the first layer of radiation-sensitive material 120 using the freeze process comprises baking (or thermally heating) the first layer of radiation sensitive material 120 to thermally cure and preserve the first pattern 122 with the first reduced CD 126. During the freeze process, the temperature and the bake time are process parameters that may be adjusted to achieve pattern CD control.

As will be discussed later and while not intended to be limiting, the terms "freeze", "freezing", "frozen", etc., as used herein, represent a process or a result of the process wherein a layer of radiation-sensitive material is prepared and/or treated to alter a condition of the layer of radiation-sensitive material to withstand subsequent lithographic processing. For example, once a pattern is frozen in the layer of radiation-sensitive material, the pattern substantially remains with or without some change to the pattern CD following an additional lithographic process.

In an alternate embodiment, the first layer of radiation-sensitive material 120 may include an electromagnetic (EM) radiation curable freeze resist, wherein freezing the first pattern 122 in the first layer of radiation-sensitive material 120 using the freeze process comprises exposing the first layer of radiation sensitive material 120 to EM radiation to radiatively cure and preserve the first pattern 122 with the first reduced CD 126. During the freeze process, the EM intensity and the time for exposure are process parameters that may be adjusted to achieve pattern CD control.

In yet another alternate embodiment, the first layer of radiation-sensitive material 120 may include a chemically curable freeze resist, wherein freezing the first pattern 122 in the first layer of radiation-sensitive material 120 using the freeze process comprises applying a chemical freeze material to and reacting the chemical freeze material with the first layer of radiation sensitive material 120 to chemically cure and preserve the first pattern 122 with the first reduced CD 126. During the freeze process, the concentration and type of the chemical freeze material, and the time for exposure are process parameters that may be adjusted to achieve pattern CD control.

Therein, a chemical freeze material may be applied over the first layer of radiation-sensitive material 120 to chemically interact with the first layer of radiation-sensitive material 120. The chemical freeze material may be formed by spin-coating the material onto substrate 110. The chemical freeze material may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat substrate 110 and cure at least a portion of the chemical freeze material.

As a result of applying the chemical freeze material to substrate 110 and heating substrate 110, a portion of the chemical freeze material reacts with the exposed surface of the first layer of radiation-sensitive material 120 to form the frozen first layer of radiation-sensitive material 120'. Thereafter, the chemical freeze material is stripped from the substrate 110 using a strip solution to preserve the first pattern 122 in the frozen first layer of radiation-sensitive material 120'. The strip solution may contain a conventional strip solution or a high normality strip solution. For example, the strip solution contains an active solute having a normality (N) greater than 0.26. Alternatively, the strip solution contains an active solute having a normality (N) greater than 0.3. Alternatively, the strip solution contains an active solute having a normality (N) greater than 0.4. Alternatively, the strip solution contains an active solute having a normality (N) greater than 0.5.

The strip solution may comprise an aqueous alkali solution. Additionally, the strip solution may contain a hydroxide. Additionally, the strip solution may contain a quaternary ammonium hydroxide. Furthermore, the strip solution may include tetramethyl ammonium hydroxide (TMAH). The normality (N) of TMAH in the strip solution may be equal to or greater than 0.26. Alternatively, the normality (N) of TMAH in the strip solution may be greater than or equal to 0.3. Alternatively, the normality (N) of TMAH in the strip solution may be greater than or equal to 0.4. Alternatively, the normality (N) of TMAH in the strip solution may be greater than or equal to 0.5. Alternatively yet, the normality (N) of TMAH in the strip solution may be about 0.32. The concentration of TMAH in the strip solution may be equal to or greater than 2.36% w/v (or 2.36 grams of solute per 100 milliliters (ml) of solution). Alternatively, the concentration of TMAH in the strip solution may be greater than 2.72% w/v (or 2.72 grams of solute per 100 milliliters (ml) of solution). Conventional strip solutions have a normality (N) of 0.26 or less. For example, TMAH-based strip solutions are readily available from a commercial vendor with a normality of 0.26.

The increase of the normality (N) in excess of 0.26 leads to an increase in substrate throughput for the double patterning process and a decrease in substrate defectivity which affects device yield.

In each embodiment, the freeze process creates a protective layer, extending partly or wholly through the first pattern 122, that protects the first pattern 122 in the first layer of radiation-sensitive material 120 from subsequent lithographic processes, such as coating, exposing, developing, and slimming processes, hence, "freezing" the first layer of radiation-sensitive material 120 to form the frozen first layer of radiation-sensitive material 120' characterized by the first reduced CD.

The first layer of radiation-sensitive material, whether it be a thermally curable freeze resist, an EM curable freeze resist, or a chemically curable freeze resist, may include a material that exhibits cross-linking when thermally treated, radiatively treated, or chemically treated. Additionally, the chemical freeze material may include any removable material that may cause cross-linking in a layer of radiation-sensitive material. The chemical freeze material may include a polymeric material. For example, these materials may include materials commercially available from JSR Micro, Inc. (1280 North Mathilda Avenue, Sunnyvale, Calif. 94089), including, for example, FZX F112 freeze material. Alternatively, for example, these materials may include materials commercially available from Rohm and Haas, a wholly owned subsidiary of Dow Chemical Company (100 Independence Mall West, Philadelphia, Pa. 19106), including, for example, SC™ 1000 Surface Curing Agents (SCA).

Figure 1E:
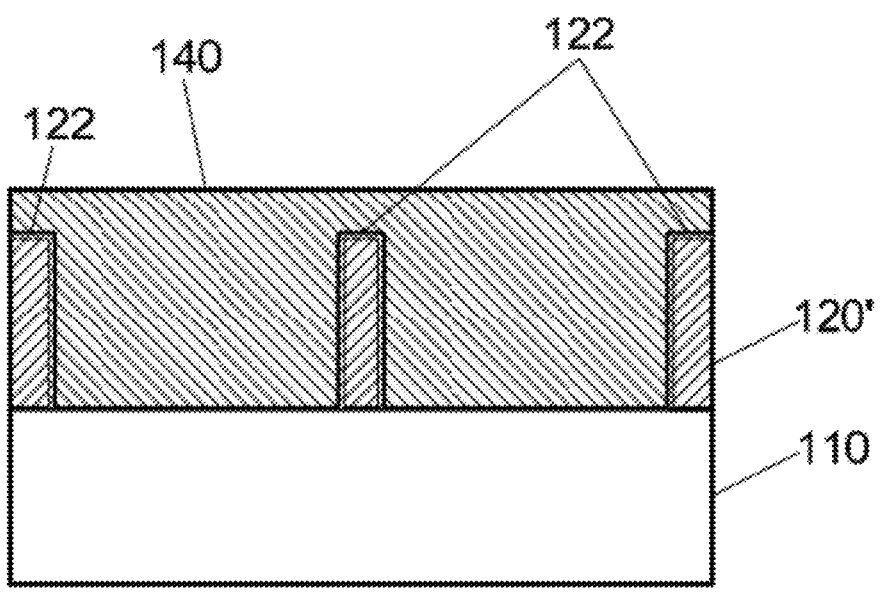

In 250 and as shown in FIG. 1E, a second layer of radiation-sensitive material 140 is formed on substrate 110. The second layer of radiation-sensitive material 140 may include a photo-resist. For example, the second layer of radiation-sensitive material 140 may comprise a 248 nm (nanometer) resist, a 193 nm resist, a 157 nm resist, an EUV (extreme ultraviolet) resists, or an electron beam sensitive resist. The second layer of radiation-sensitive material 140 may be formed by spin-coating the material onto substrate 110. The second layer of radiation-sensitive material 140 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more second PABs to heat the substrate 110 and one or more cooling cycles, following the one or more second PABs, to cool the substrate 110.

Figure 1F:
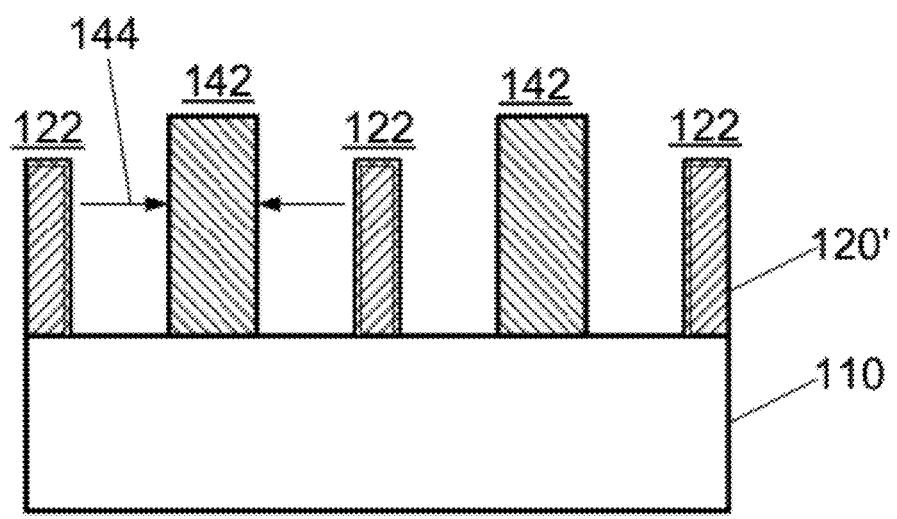

In 260 and as shown in FIG. 1F, the substrate 110 having the second layer of radiation-sensitive material 140 is aligned at a second alignment position in a radiation exposure system and imaged with second radiation having a second image pattern. The second radiation may be the same as the first radiation or different than the first radiation. The radiation exposure system may include a dry or wet photo-lithography system. The second image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the second image pattern may be formed using an electron beam lithography system.

The second layer of radiation-sensitive material 140, having been exposed to the second image pattern, is subjected to a developing process in order to remove the second image pattern region, and form a second pattern 142 in the second layer of radiation-sensitive material 140. The second pattern 142 may be characterized by a second critical dimension (CD) 144. The second pattern 142 may include a second line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more second PEBs to heat the substrate 110 and one or more cooling cycles, following the one or more second PEBs, to cool the substrate 110.

Figure 1G:
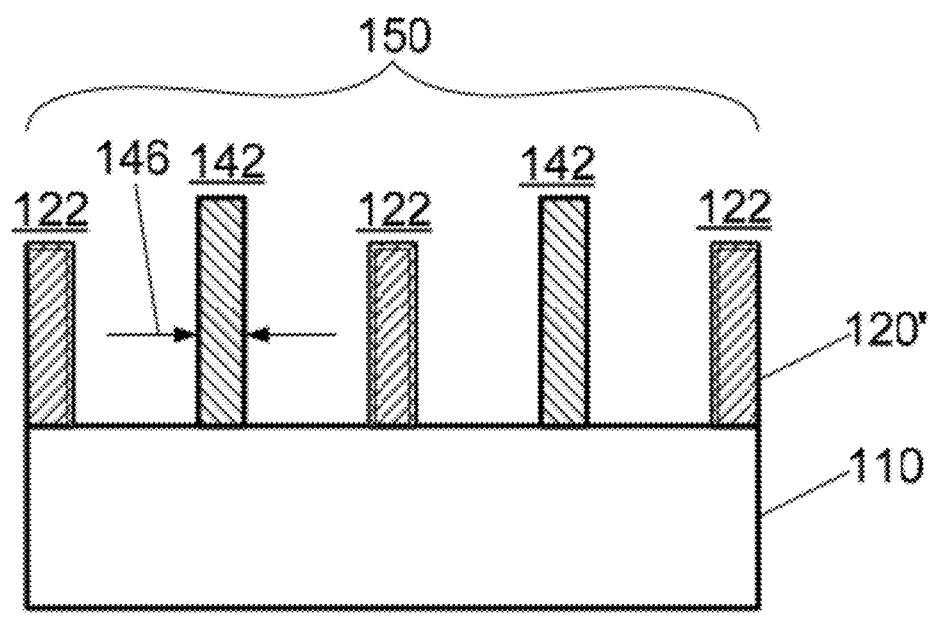
Figure 2:
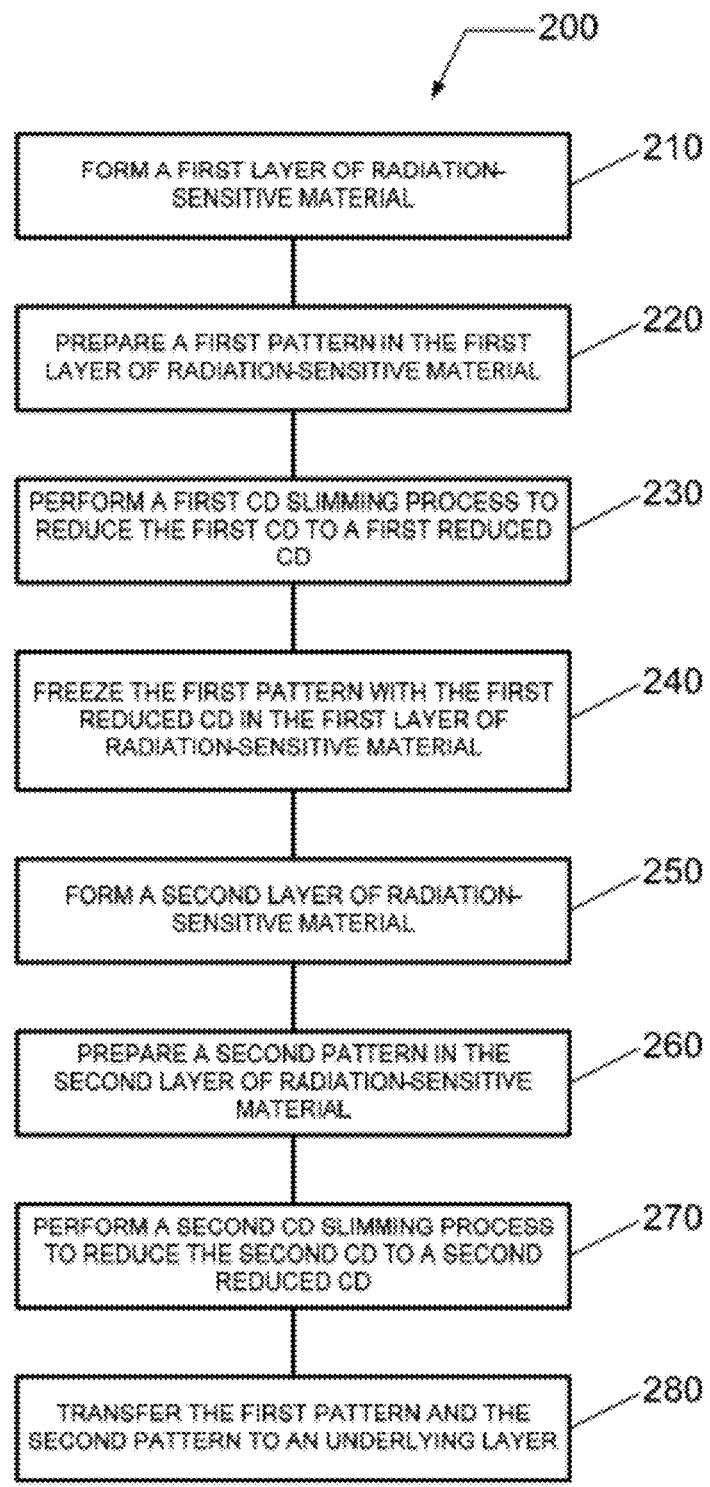
FIG. 2 illustrates a method of double patterning a substrate according to another embodiment.

In 270 and as shown in FIG. 1G, a second critical dimension (CD) slimming process is performed to reduce the second CD 144 to a second reduced CD 146, thus leaving behind a double pattern 150 having the first pattern 122 and the second pattern 142. FIG. 3 illustrates a CD slimming process, and FIGS. 4A and 4B provide exemplary data for the CD slimming process.

In 280, the double pattern 150, including the first pattern 122 with the first reduced CD 126 and the second pattern 142 with the second reduced CD 146, is transferred to an underlying layer of the substrate 110 using one or more etching processes. The one or more etching processes may include any combination of wet or dry etching processes. The dry etching processes may include dry plasma etching processes or dry non-plasma etching processes.

As illustrated pictorially in FIG. 3, the CD slimming process, such as the first CD slimming process and/or the second CD slimming process referred to above, comprises a process sequence 300 beginning with preparing a layer of radiation-sensitive material 320 overlying a substrate 310. As described above, following the exposure of the layer of radiation-sensitive material 320 to electromagnetic (EM) radiation in the photo-lithography system, the layer of radiation-sensitive material 320 is developed by exposing the layer of radiation-sensitive material 320 to a first developing solution, thus, leaving behind a pattern 321 having CD 325. During the exposure of the layer of radiation-sensitive material 320 to EM radiation, a (cross-hatched) portion of the pattern 321 is exposed to EM radiation of intermediate intensity, yet remains following exposure to the first developing solution.

In 301, the layer of radiation-sensitive material 320 is developed further by exposing the layer of radiation-sensitive material 320 to a second developing solution at an elevated temperature. In doing so, the second developing solution at the elevated temperature removes the (cross-hatched) portion of the pattern 321 that is exposed to EM radiation of intermediate intensity leaving behind an intermediate pattern 322 with an intermediate reduced CD 326. As an example, the second developing solution may include a TMAH-containing solution elevated to a hot develop temperature greater than or equal to about 23 degrees C. Alternatively, as an example, the second developing solution may include a TMAH-containing solution elevated to a hot develop temperature greater than or equal to about 25 degrees C. Alternatively, as an example, the second developing solution may include a TMAH-containing solution elevated to a hot develop temperature greater than or equal to about 30 degrees C. Alternatively, as an example, the second developing solution may include a TMAH-containing solution elevated to a hot develop temperature greater than or equal to about 23 degrees C. and less than or equal to about 50 degrees C. Alternatively yet, as an example, the second developing solution may include a TMAH-containing solution elevated to a hot develop temperature greater than or equal to about 30 degrees C. and less than or equal to about 50 degrees C. In this process step, the concentration of the developing solution, the temperature, and the time for exposure are process parameters that may be adjusted to achieve pattern CD control.

In 302, the intermediate pattern 322 with intermediate reduced CD 326 is treated with an acid (represented with "+" signs, and/or $H^+$) solution. As an example, an acid-containing solution may be applied to the layer of radiation-sensitive material 320 with intermediate reduced CD 326 via spin-coating, as described above. In this process step, the concentration of the acid-containing solution, the temperature, and the time for exposure are process parameters that may be adjusted to achieve pattern CD control.

In 303, the layer of radiation-sensitive material 320 is elevated in temperature to diffuse the acid into the pattern in the layer of radiation-sensitive material 320. As an example, the layer of radiation-sensitive material 320 is elevated to a bake temperature greater than or equal to about 50 degrees C. Alternatively, as an example, the layer of radiation-sensitive material 320 is elevated to a bake temperature ranging from about 50 degrees C. to about 180 degrees C. In this process step, the temperature and the time for exposure are process parameters that may be adjusted to achieve pattern CD control.

In 304, the layer of radiation-sensitive material 320 is developed further yet by exposing the layer of radiation-sensitive material 320 to a third developing solution. In doing so, the third developing solution produces a final pattern 323 in the layer of radiation-sensitive material 320 with a reduced CD 335. As an example, the third developing solution may include a TMAH-containing solution at room temperature. In this process step, the concentration of the developing solution, the temperature, and the time for exposure are process parameters that may be adjusted to achieve pattern CD control.

Additional details for a CD slimming process may be found in U.S. Patent Application Publication Serial No. 2010/0291490A1, entitled "Resist Pattern Slimming Treatment Method". Other details for a CD slimming process may be found in U.S. patent application Ser. No. 12/751,362, entitled "Method of Slimming Radiation-Sensitive Material Lines in Lithographic Applications" and filed on Mar. 31, 2010, or U.S. patent application Ser. No. 13/077,833, entitled "Method of Slimming Radiation-Sensitive Material Lines in Lithographic Applications" and filed on Mar. 31, 2011.

As shown in FIGS. 4A and 4B, a CD slimming process is performed to reduce a first line CD 410 of about 50 nm (nanometers) to a second line CD 420 of about 29.2 nm.

At least one process parameter for the first CD slimming process, the second CD slimming process, the freeze process, the first lithographic process, or the second lithographic process, or any combination of two or more thereof may be optimized to prevent collapse of said first pattern and said second pattern. Further, at least one process parameter for the first CD slimming process, the second CD slimming process, the freeze process, the first lithographic process, or the second lithographic process, or any combination of two or more thereof may be optimized to produce the second reduced CD in the second pattern while minimally impacting the first reduced CD in the first pattern that has been subjected to the freeze process.

As an example, the first CD for the first pattern and/or the second CD for the second pattern may be adjusted to achieve optimal printing of the first and second patterns with reduced CD. Alternatively, as an example, the amount of reduction between the first CD and the first reduced CD and/or the amount of reduction between the second CD and the second reduced CD may be adjusted to achieve optimal printing of the first and second patterns with reduced CD.

In one embodiment, the second CD slimming process may be designed to achieve the second reduced CD in the second pattern, while minimally impacting the first reduced CD in the first pattern. For example, the first lithographic process and the second lithographic process may be performed to print a first CD and a second CD that are substantially or approximately equivalent. Thereafter, the first CD slimming process reduces the first CD to the first reduced CD, and the second CD slimming process reduces the second CD to the second reduced CD, while not impacting the first reduced CD, such that the first reduced CD and the second reduced CD are substantially or approximately equivalent.

In an alternate embodiment, the second CD slimming process may be designed to achieve reduction of both the first reduced CD and the second CD. For example, the first lithographic process and the second lithographic process may be performed to achieve a first CD and a second CD, wherein the first CD is printed larger than the second CD. Additionally, for example, the first CD may be printed up to about 5% larger than the second CD. Additionally, for example, the first CD may be printed up to about 10% larger than the second CD. Additionally, for example, the first CD may be printed up to about 15% larger than the second CD. Additionally, for example, the first CD may be printed up to about 25% larger than the second CD. Additionally, for example, the first CD may be printed about 25% to about 50% larger than the second CD. Additionally yet, for example, the first CD may be printed about 50% to about 75% larger than the second CD. Thereafter, the first CD slimming process reduces the first CD to the first reduced CD, and the second CD slimming process reduces the second CD to the second reduced CD, while further reducing the first reduced CD to a third reduced CD, such that the third reduced CD and the second reduced CD are substantially or approximately equivalent.

Figure 5:
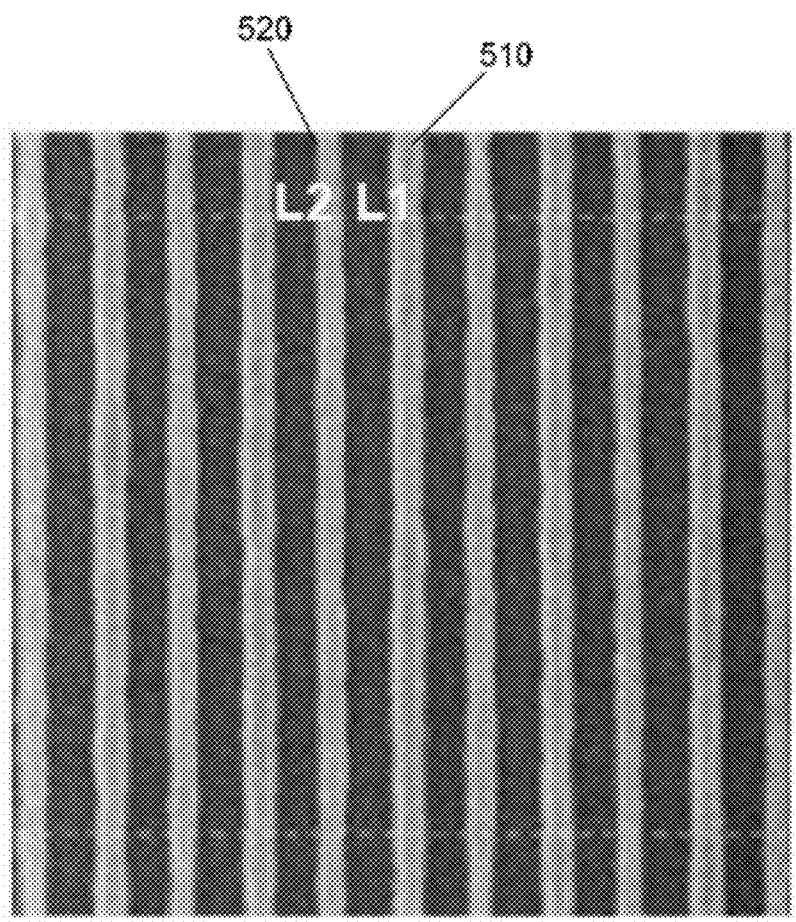
FIG. 5 provides exemplary data for a method of double patterning a substrate.

As shown in FIG. 5, sub-30 nm (nanometer), 1:1 pitch line patterns containing a first line pattern 510 and a second line pattern 520 may be produced. Additionally, sub-25 nm (nanometer), 1:1 pitch line patterns may be produced, and even sub-20 nm (nanometer), 1:1 pitch line patterns may be produced. For example, using a thermally curable freeze resist as the first layer of radiation-sensitive material, the inventors have discovered that sub-20 nm (nanometer), 1:1 pitch line patterns may be produced by printing the first CD larger than the second CD using the first and second lithographic processes, respectively, and optimizing the second CD slimming process.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for double patterning a substrate, comprising:
    forming a first layer of radiation-sensitive material;
    preparing a first pattern in said first layer of radiation-sensitive material using a first lithographic process, said first pattern being characterized by a first critical dimension (CD);
    following said preparing said first pattern, performing a first CD slimming process to reduce said first CD to a first reduced CD;
    freezing said first pattern with said first reduced CD in said first layer of radiation-sensitive material using a freeze process;
    forming a second layer of radiation-sensitive material on said first pattern with said first reduced CD in said first layer of radiation-sensitive material;
    preparing a second pattern in said second layer of radiation-sensitive material using a second lithographic process, said second pattern being characterized by a second CD; and
    following said preparing said second pattern, performing a second CD slimming process to reduce said second CD to a second reduced CD.

2. The method of claim 1, wherein said first layer of radiation-sensitive material comprises a thermally curable freeze resist, and wherein said freezing said first pattern in said first layer of radiation-sensitive material using said freeze process comprises baking said first layer of radiation-sensitive material to thermally cure and preserve said first pattern with said first reduced CD.

3. The method of claim 1, wherein said first layer of radiation-sensitive material comprises an electromagnetic (EM) radiation curable freeze resist, and wherein said freezing said first pattern in said first layer of radiation-sensitive material using said freeze process comprises exposing said first layer of radiation-sensitive material to EM radiation to radiatively cure and preserve said first pattern with said first reduced CD.

4. The method of claim 1, wherein said first layer of radiation-sensitive material comprises a chemically curable freeze resist, and wherein said freezing said first pattern in said first layer of radiation-sensitive material using said freeze process comprises:
    applying a chemical freeze material over said first layer of radiation-sensitive material;
    reacting said chemical freeze material with said first layer of radiation-sensitive material to chemically cure and preserve said first pattern with said first reduced CD in said first layer of radiation-sensitive material; and
    stripping said chemical freeze material.

5. The method of claim 1, further comprising:
    transferring said first pattern and said second pattern to an underlying layer.

6. The method of claim 1, further comprising:
    producing a line pattern pitch for said first pattern and said second pattern that ranges from about 1:1 to about 1:2, wherein said first pattern comprises a first line pattern and said second pattern comprises a second line pattern.

7. The method of claim 1, wherein said first reduced CD is less than about 30 nanometers (nm), and said second reduced CD is less than about 30 nm.

8. The method of claim 1, wherein said first reduced CD is less than about 25 nm, and said second reduced CD is less than about 25 nm.

9. The method of claim 1, wherein said first CD slimming process comprises:
    dispensing a developing solution on said substrate, said developing solution heated to a hot develop temperature exceeding 30 degrees C.;
    treating said substrate with a treatment compound containing an acid;
    baking said substrate to diffuse said acid into said first pattern; and
    dispensing another developing solution on said substrate.

10. The method of claim 1, wherein said second CD slimming process comprises:

dispensing a developing solution on said substrate, said developing solution heated to a hot develop temperature exceeding 30 degrees C.;

treating said substrate with a treatment compound containing an acid;

baking said substrate to diffuse said acid into said second pattern; and dispensing another developing solution on said substrate.

11. The method of claim 1, further comprising:

optimizing at least one process parameter for said first CD slimming process, said second CD slimming process, said freeze process, said first lithographic process, or said second lithographic process, or any combination of two or more thereof to prevent collapse of said first pattern and said second pattern.

12. The method of claim 2, further comprising:

optimizing at least one process parameter for said first CD slimming process, said second CD slimming process, said freeze process, said first lithographic process, or said second lithographic process, or any combination of two or more thereof to produce said second reduced CD in said second pattern while minimally impacting said first reduced CD in said first pattern that has been subjected to said freeze process.

13. The method of claim 1, further comprising:

preparing said first CD in said first pattern larger than said second CD in said second pattern.

14. The method of claim 13, wherein said first CD is up to about 25% larger than said second CD.

15. The method of claim 13, wherein said first CD is up to about 10% larger than said second CD.

16. The method of claim 1, wherein said forming said first layer of radiation-sensitive material comprises spin-coating said substrate with photo-resist, and wherein said forming said second layer of radiation-sensitive material comprises spin-coating said substrate with photo-resist.

17. The method of claim 1, wherein said preparing said first pattern in said first layer of radiation-sensitive material comprises:

aligning said substrate at a first alignment position in a radiation exposure system;

exposing said first layer of radiation-sensitive material to first radiation;

performing a first post-exposure bake of said first layer of radiation-sensitive material;

cooling said substrate following said first post-exposure bake; and developing said first layer of radiation-sensitive material to form said first pattern therein.

18. The method of claim 1, wherein said preparing said second pattern in said second layer of radiation-sensitive material comprises:

aligning said substrate at a second alignment position in a radiation exposure system;

exposing said second layer of radiation-sensitive material to second radiation;

performing a second post-exposure bake of said second layer of radiation-sensitive material;

cooling said substrate following said second post-exposure bake; and developing said second layer of radiation-sensitive material to form said second pattern therein.

\* \* \* \* \*